United States Patent
Chiang et al.

(10) Patent No.: US 7,522,081 B1
(45) Date of Patent: Apr. 21, 2009

(54) DIGITAL-TO-ANALOG CONVERTER BASED ON A PRE-DECODER, A BINARY DECODER AND ROM DECODERS

(75) Inventors: Cheng-Lung Chiang, Tainan County (TW); Ming-Cheng Chiu, Tainan County (TW); Ting-Jung Ku, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/018,805

(22) Filed: Jan. 24, 2008

(51) Int. Cl.
*H03M 1/66* (2006.01)
(52) U.S. Cl. ................. 341/144; 341/145; 341/154
(58) Field of Classification Search ............. 341/145, 341/154
See application file for complete search history.

(56) References Cited
U.S. PATENT DOCUMENTS

| | | | | |
|---|---|---|---|---|
| 6,326,913 B1 * | 12/2001 | Chao et al. | ........... | 341/144 |
| 6,781,535 B2 * | 8/2004 | Lee | ........... | 341/144 |
| 7,161,517 B1 * | 1/2007 | Yen et al. | ........... | 341/145 |
| 7,236,114 B2 * | 6/2007 | Ahn | ........... | 341/144 |

* cited by examiner

*Primary Examiner*—Khai M Nguyen
(74) *Attorney, Agent, or Firm*—Winston Hsu

(57) ABSTRACT

For reducing device areas required by digital-to-analog converters used in source driving circuits of a liquid crystal display device, a compound circuit structure based on a pre-decoder, a binary decoder, and ROM decoders is set forth to meet the demand for cutting down the device areas. The pre-decoder is configured to decode a first sub-signal of a digital data signal for generating a plurality of control signals. Each of the ROM decoders is configured to select a gamma reference voltage out of one corresponding set of gamma reference voltages based on the control signals and a second sub-signal of the digital data signal. The binary decoder is configured to select one of the gamma reference voltages selected by the ROM decoders based on a third sub-signal of the digital data signal for outputting an output voltage. The number of transistors used by the compound circuit structure is then reduced significantly.

23 Claims, 10 Drawing Sheets

US 7,522,081 B1

DIGITAL-TO-ANALOG CONVERTER BASED ON A PRE-DECODER, A BINARY DECODER AND ROM DECODERS

BACKGROUND OF THE INVENTION

1. Field of the Invention

The present invention relates to a digital-to-analog converter, and more particularly, to a digital-to-analog converter based on a pre-decoder, a binary decoder and ROM decoders.

2. Description of the Prior Art

Because liquid crystal display (LCD) devices are characterized by thin appearance, low power consumption, and low radiation, LCD devices have been widely applied in various electronic products such as computer monitors, mobile phones, personal digital assistants (PDAs), or flat panel televisions. The operation principle of an LCD device is to vary voltages dropped on two terminals of liquid crystal cells in order to change the twisted angle of the liquid crystal molecules so that the transparency of the liquid crystal cells can be changed for illustrating images. As to most of portable communication devices using the LCD devices and having limited power provided by the battery devices, how to provide LCD devices with higher power efficiency, lower production cost, and smaller size to meet customer value has become a key issue to the future display development.

Please refer to FIG. 1, which is a block diagram schematically showing a conventional LCD device 100. The LCD device 100 comprises a source driving device 110 and a display panel 190. The source driving device 110 comprises a latch control shift unit 120 and a plurality of source driving circuits 130_1-130_n. The latch control shift unit 120 comprises a plurality of shift registers 120_1-120_n. The plurality of shift registers 120_1-120_n are used for inputting pixel data signals into the plurality of source driving circuits 130_1-130_n. Each of the plurality of source driving circuits 130_1-130_n comprises a latch 140, a digital-to-analog converter (DAC) 150, and a buffer 160.

The display panel 190 is coupled to the plurality of source driving circuits 130_1-130_n via a plurality of data lines DL_1-DL_n. The pixel data signal corresponding to each of the data lines DL_1-DL_n is inputted to the corresponding latch 140 and is converted into an analog pixel data signal by the corresponding digital-to-analog converter 150. The analog pixel data signal is outputted through the corresponding buffer 160 to the display panel 190 via one corresponding data line.

It is obvious from the above description that each of the plurality of source driving circuits 130_1-130_n comprises one digital-to-analog converter 150 for performing a digital-to-analog converting process on the corresponding pixel data signal in digital form. That is, if there are 1024 data lines for inputting analog pixel data signals to the display panel 190, then the source driving device 110 requires 1024 digital-to-analog converters 150. In this way, if each of the plurality of digital-to-analog converters 150 consumes a significant device area, then a large circuit layout area for the source driving device 110 of the LCD device 100 is required and hence it is hard to achieve thinner appearance and to cut down the related cost.

Please refer to FIG. 2, which is a circuit diagram schematically showing a prior-art digital-to-analog converter 290 based on ROM decoder architecture. The digital-to-analog converter 290 comprises a plurality of transistor arrays 200-263 and a buffer 280. The plurality of transistor arrays 200-263 are utilized to select one of gamma reference voltages Vr0-Vr63 based on an 6-bit digital data signal D0-D5 and a complementary 6-bit digital data signal D0B-D5B so as to output an output voltage Vout via the buffer 280. Each of the plurality of transistor arrays 200-263 comprises 6 transistors, and hence the plurality of transistor arrays 200-263 comprises 384 transistors. Accordingly, the prior-art digital-to-analog converter 290 consumes a significant device area, and therefore a large circuit layout area for the source driving device of an LCD device using a plurality of the prior-art digital-to-analog converters 290 is required.

SUMMARY OF THE INVENTION

In accordance with an embodiment of the present invention, a digital-to-analog converter for meeting the demand of reducing layout areas is provided. The digital-to-analog converter is utilized for selecting one gamma reference voltage out of a plurality of gamma reference voltages based on an N-bit digital data signal so as to output an output voltage. The plurality of gamma reference voltages is divided into a plurality of sets of gamma reference voltages. The digital-to-analog converter comprises a pre-decoder, a plurality of ROM decoders, and a binary decoder.

The pre-decoder is configured to decode an N1-bit sub-signal of the N-bit digital data signal for generating a plurality of control signals and a plurality of complementary control signals. Each of the plurality of ROM decoders is coupled to the pre-decoder for selecting one gamma reference voltage out of one corresponding set of gamma reference voltages based on the control signals and the complementary control signals, an N2-bit sub-signal of the N-bit digital signal, and a complement of the N2-bit sub-signal. The binary decoder is coupled to the plurality of ROM decoders for selecting one of the gamma reference voltages selected by the plurality of ROM decoders based on an N3-bit sub-signal of the N-bit digital signal and a complement of the N3-bit sub-signal so as to output the output voltage.

The present invention further provides a digital-to-analog converter for meeting the demand of reducing layout areas. The digital-to-analog converter comprises a plurality of input pads, a pre-decoder, a binary decoder, a first ROM decoder, and a second ROM decoder.

The plurality of input pads are disposed in a first row area for inputting a digital data signal and a complement of the digital data signal. The pre-decoder is disposed in a second row area next to the plurality of input pads for receiving an N1-bit sub-signal of the digital data signal from corresponding input pads, and for decoding the N1-bit sub-signal so as to output a plurality of control signals and a plurality of complementary control signals. The binary decoder is disposed in a third row area next to the pre-decoder for receiving an N3-bit sub-signal of the digital data signal from corresponding input pads, a complement of the N3-bit sub-signal from corresponding input pads, a first gamma reference voltage, and a second gamma reference voltage, and for selecting one of the first and second gamma reference voltages based on the N3-bit sub-signal and the complement of the N3-bit sub-signal so as to output an output voltage. The first ROM decoder is disposed in a fourth row area next to the binary decoder for receiving an N2-bit sub-signal of the digital data signal from corresponding input pads, a complement of the N2-bit sub-signal from corresponding input pads, a first set of gamma reference voltages, the control signals from the pre-decoder, and the complementary control signals for the pre-decoder, and for selecting one gamma reference voltage of the first set of gamma reference voltages based on the control signals, the N2-bit sub-signal and the complement of the N2-bit sub-signal so as to output the first gamma reference voltage. The second ROM decoder is disposed in a fifth row area next to the first ROM decoder for receiving the N2-bit sub-signal of the digital data signal from corresponding input pads, the complement of the N2-bit sub-signal from corresponding input pads, a second set of gamma reference voltages, the control signals from the pre-decoder, and the complementary control signals from the pre-decoder, and for selecting one gamma reference voltage of the second set of gamma reference voltages based on the control signals, the N2-bit sub-signal and the complement of the N2-bit sub-signal so as to output the second gamma reference voltage out of the second set of gamma reference voltages.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
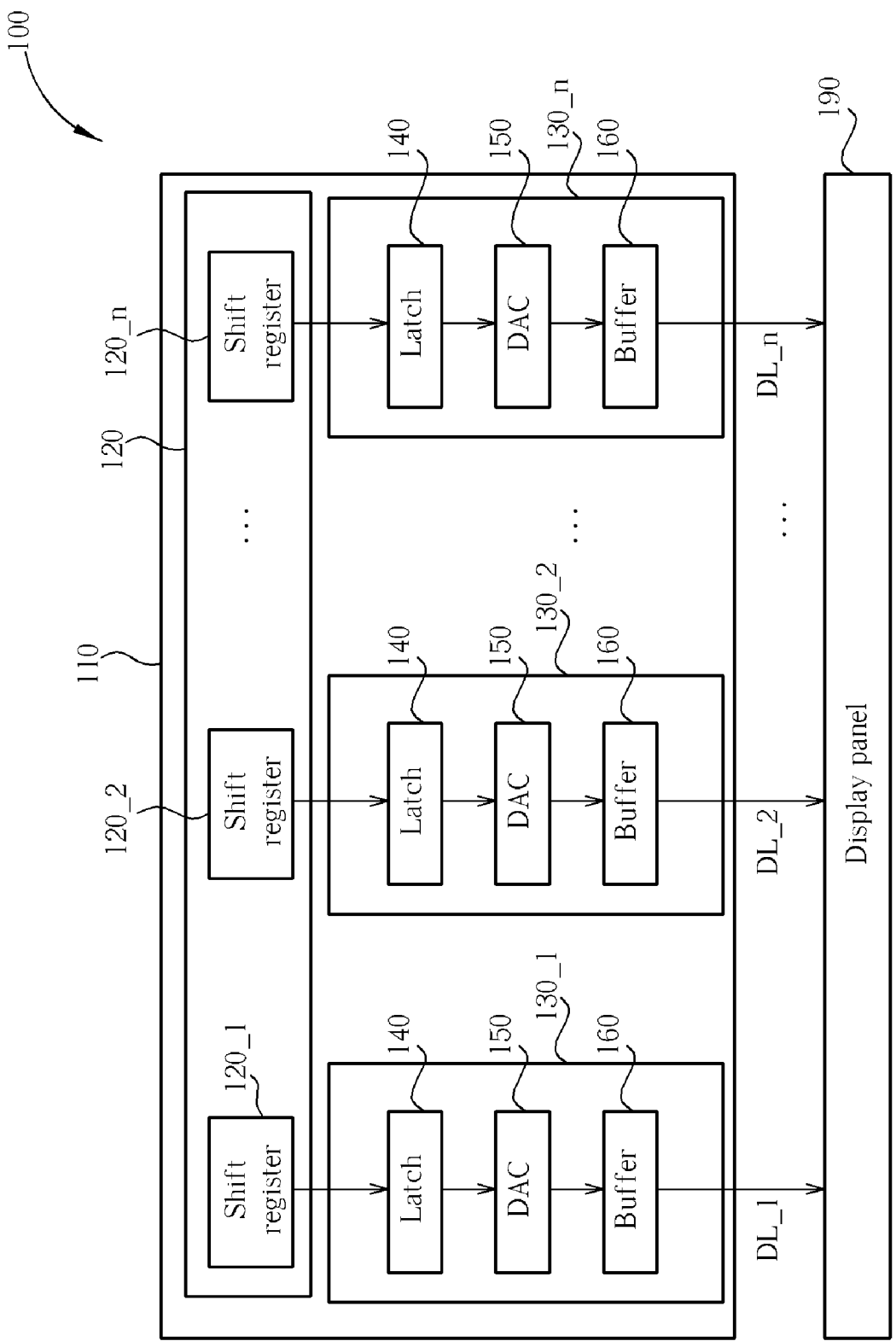
FIG. 1 is a block diagram schematically showing a conventional LCD device.
Figure 2:
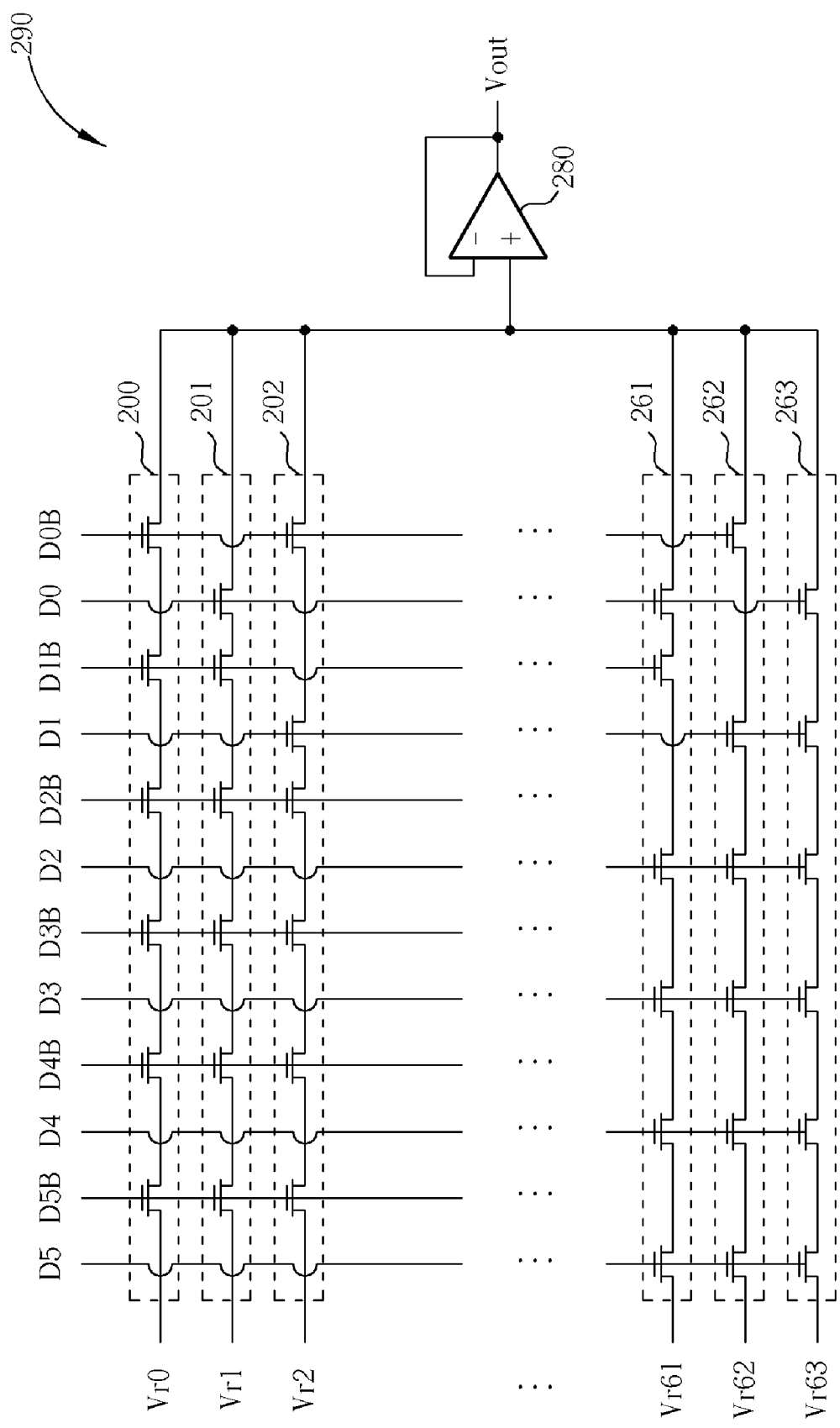
FIG. 2 is a circuit diagram schematically showing a prior-art digital-to-analog converter based on ROM decoder architecture.
Figure 3:
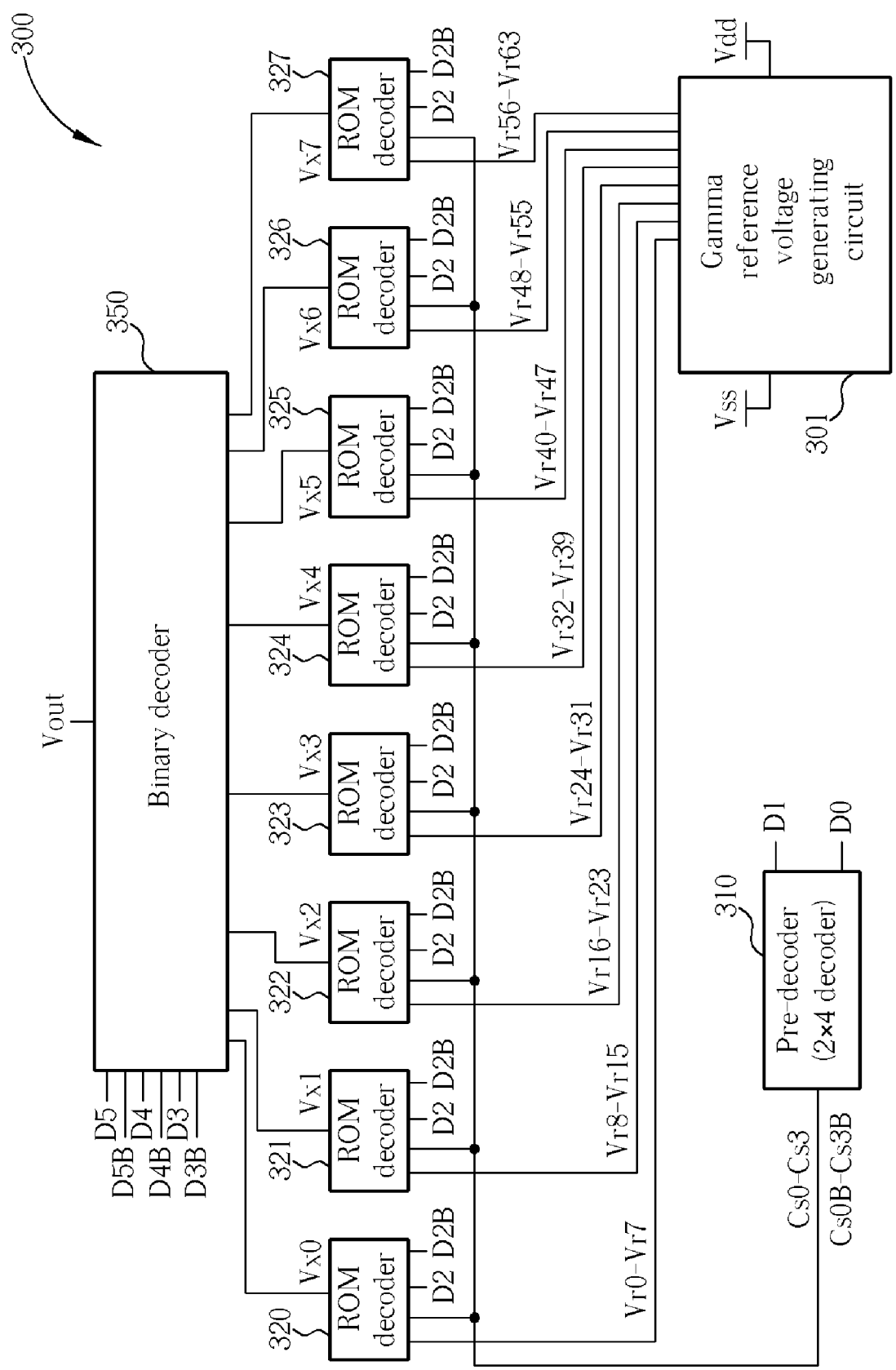
FIG. 3 is a block diagram schematically showing a digital-to-analog converter in accordance with an embodiment of the present invention.

Please refer to FIG. 3, which is a block diagram schematically showing a digital-to-analog converter 300 in accordance with an embodiment of the present invention. The digital-to-analog converter 300 comprises a gamma reference voltage generating circuit 301, a pre-decoder 310, a plurality of ROM decoders 320-327, and a binary decoder 350. The gamma reference voltage generating circuit 301 comprises a voltage divider having an array of resistors connected in series between two supply voltage levels Vss and Vdd. For purpose of explanation, suppose that the digital-to-analog converter 300 is utilized to select one of gamma reference voltages Vr0-Vr63 based on six-bit digital data D0-D5 and related complementary digital data D0B-D5B so as to output an output voltage Vout, and hence the gamma reference voltage generating circuit 301 is utilized to generate 64 gamma reference voltages Vr0-Vr63 via the voltage divider. In the embodiment shown in FIG. 3, the complementary digital data D0B and D1B can be omitted. Whether the complementary digital data D0B and D1B can be omitted or not depends on the design of the pre-decoder 310 to be described below. Please note that the present invention is not limited to the digital-to-analog converter based on six-bit digital data, and any digital-to-analog converter based on digital data other than the six-bit digital data by using same structural design is still within the spirit and scope of the invention. Because the gamma reference voltage generating circuit 301 is a well-known technology, and for the sake of brevity, further discuss on the gamma reference voltage generating circuit 301 is omitted.

The pre-decoder 310 is a two-to-four decoder in the embodiment, and is utilized to convert two-bit digital data D0 and D1 into four control signals Cs0-Cs3 and four complementary control signals Cs0B-Cs3B. The plurality of gamma reference voltages Vr0-Vr63 are divided into eight sets of gamma reference voltages, which are furnished to the plurality of ROM decoders 320-327 respectively. For instance, the set of gamma reference voltages Vr0-Vr7 is provided to the ROM decoder 320, and the set of gamma reference voltages Vr8-Vr15 is provided to the ROM decoder 321, etc. Each of the plurality of ROM decoders 320-327 selects a gamma reference voltage out of one corresponding set of gamma reference voltages inputted from the gamma reference voltage generating circuit 301 based on the four control signals Cs0-Cs3, the four complementary control signals Cs0B-Cs3B, the digital data D2 and the complementary digital data D2B, and the gamma reference voltage being selected is furnished to the binary decoder 350. For instance, the ROM decoder 320 furnishes a gamma reference voltage Vx0 selected from the set of gamma reference voltages Vr0-Vr7 to the binary decoder 350, the ROM decoder 321 furnishes a gamma reference voltage Vx1 selected from the set of gamma reference voltages Vr8-Vr15 to the binary decoder 350, and the ROM 327 furnishes a gamma reference voltage Vx7 selected from the set of gamma reference voltages Vr56-Vr63 to the binary decoder 350, etc. The binary decoder 350 selects one of the eight gamma reference voltages Vx0-Vx7 being selected by the eight ROM decoders 320-327 so as to output the output voltage Vout based on the digital data D3-D5 and the complementary digital data D3B-D5B.

Figure 4:
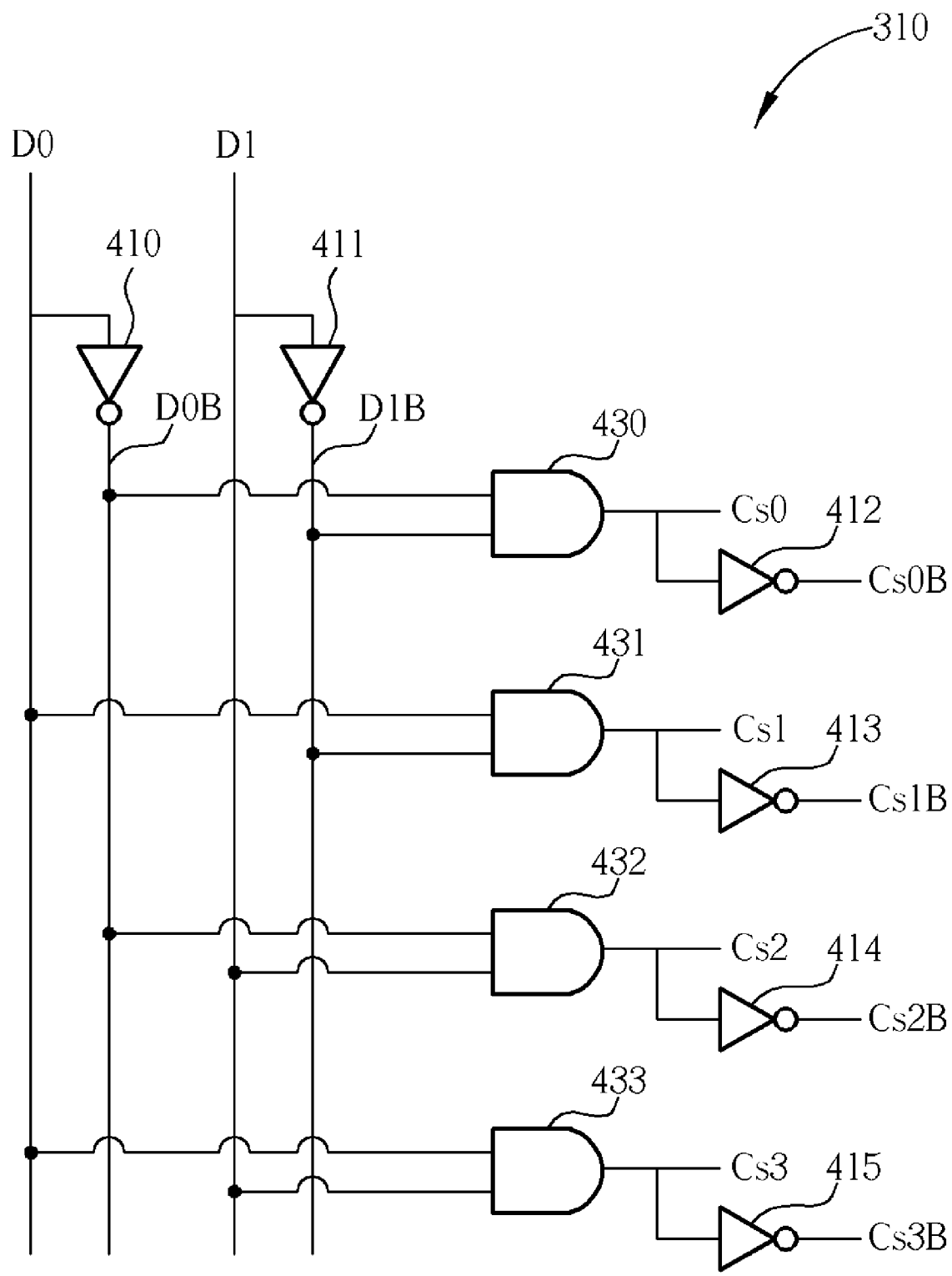
FIG. 4 is a circuit diagram schematically showing the circuit structure of the pre-decoder in FIG. 3.

Please refer to FIG. 4, which is a circuit diagram schematically showing the circuit structure of the pre-decoder 310 in FIG. 3. The pre-decoder 310 comprises a plurality of inverters 410-415 and a plurality of AND gates 430-433. The inverters 410 and 411 are utilized to invert the digital data D0, D1 for generating complementary digital data D0B, D1B respectively. In another embodiment, the complementary digital data D0B, D1B can be provided directly from external circuits and the inverters 410 and 411 can be omitted. The plurality of AND gates 430-433 are utilized to generate the control signals Cs0-Cs3 respectively based on the digital data D0, D1 and the complementary digital data D0B, D1B. The plurality of inverters 430-433 are utilize to invert the control signals Cs0-Cs3 for generating the complementary control signals Cs0B-Cs3B respectively. The pre-decoder 310 is a well-known circuit design, and for the sake of brevity, further detailed description is omitted.

Figure 5:
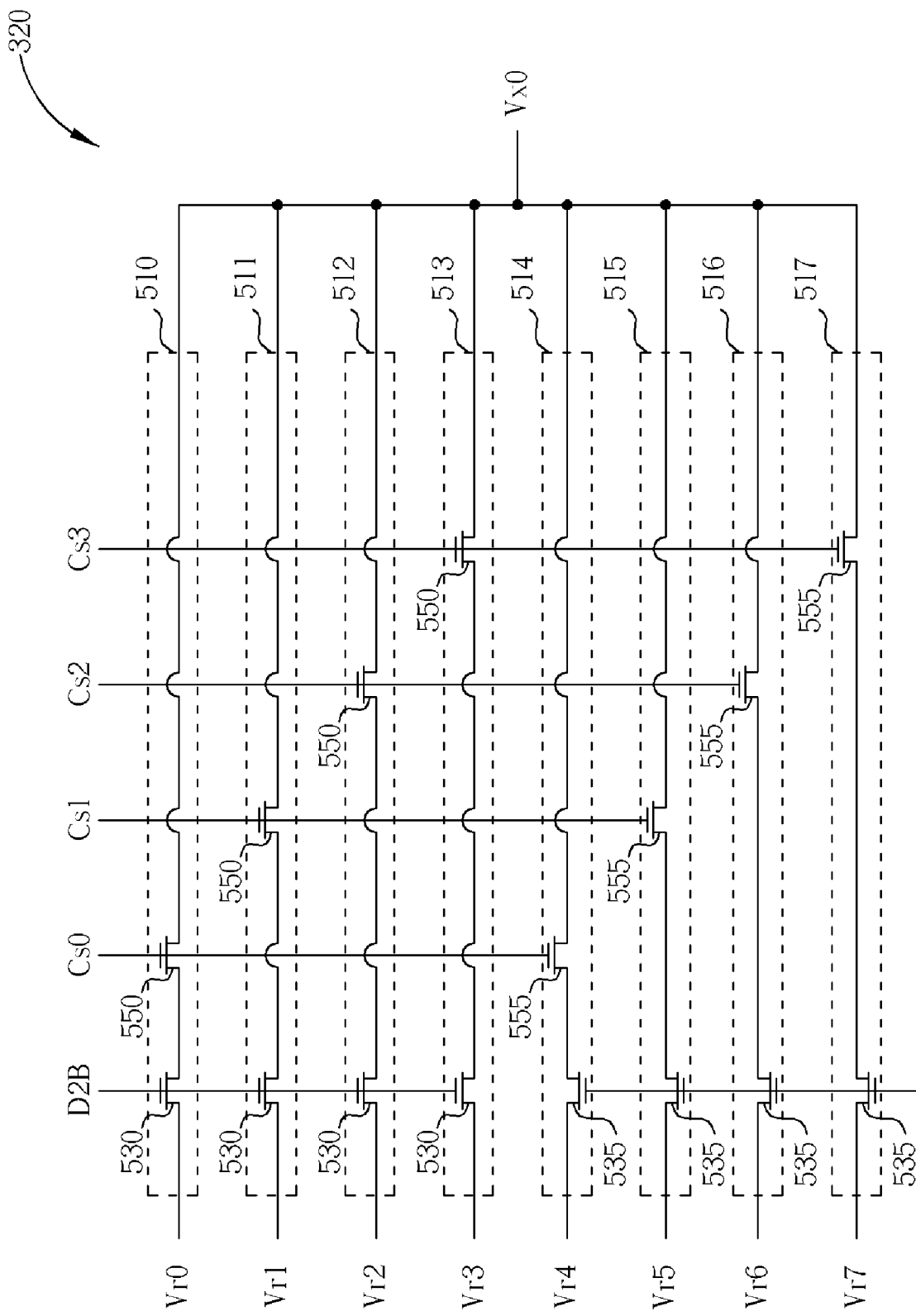
FIG. 5 is a circuit diagram schematically showing the circuit structure of the ROM decoder in FIG. 3 in accordance with a preferred embodiment of the present invention.

Please refer to FIG. 5, which is a circuit diagram schematically showing the circuit structure of the ROM decoder 320 in accordance with a preferred embodiment of the present invention. The ROM decoder 320 comprises a plurality of transistor arrays 510-517. Each of the transistor arrays 510-513 comprises corresponding NMOS transistors 530 and 550. Each of the transistor arrays 514-517 comprises corresponding NMOS transistors 535 and 555. Each of the NMOS transistors 530 has a first end coupled for receiving a corresponding gamma reference voltage, a second end, and a gate coupled for receiving the complementary digital data D2B. For example, the first end of the NMOS transistors 530 of the transistor array 510 is coupled for receiving the gamma reference voltages Vr0, and the first end of the NMOS transistors 530 of the transistor array 511 is coupled for receiving the gamma reference voltages Vr1, etc. Each of the NMOS transistors 535 has a first end coupled for receiving a corresponding gamma reference voltage, a second end, and a gate coupled for receiving the digital data D2. For example, the first end of the NMOS transistors 535 of the transistor array 514 is coupled for receiving the gamma reference voltages Vr4, and the first end of the NMOS transistors 535 of the transistor array 515 is coupled for receiving the gamma reference voltages Vr5, etc.

Each of the NMOS transistors 550 has a first end coupled to the second end of the corresponding NMOS transistor 530, a gate coupled for receiving a corresponding control signal, and a second end coupled for outputting the corresponding gamma reference voltage received by the first end of the corresponding NMOS transistor 530. For example, the gate of the NMOS transistors 550 of the transistor arrays 510 is coupled for receiving the control signal Cs0, and the gate of the NMOS transistors 550 of the transistor arrays 511 is coupled for receiving the control signal Cs1, etc. Each of the NMOS transistors 555 has a first end coupled to the second end of the corresponding NMOS transistor 535, a gate coupled for receiving a corresponding control signal, and a second end coupled for outputting the corresponding gamma reference voltage received by the first end of the corresponding NMOS transistor 535. For example, the gate of the NMOS transistors 555 of the transistor arrays 514 is coupled for receiving the control signal Cs0, and the gate of the NMOS transistors 555 of the transistor arrays 515 is coupled for receiving the control signal Cs1, etc. In one embodiment, the NMOS transistors 530 and the NMOS transistors 535 are disposed along one column, and the NMOS transistors 550 and the NMOS transistors 555 are disposed along another column.

Accordingly, the signal connection between two terminals of each of the plurality of transistor arrays 510-517 is controlled by the control signals Cs0-Cs3, the digital data D2, or the complementary digital data D2B. For instance, if the control signals Cs0-Cs3 are "1000" and the digital data D2 is "1", then the signal connection between two terminals of the transistor arrays 514 is enabled, and the gamma reference voltage Vr4 is forwarded as the gamma reference voltage Vx0. Alternatively, if the control signals Cs0-Cs3 are "0010" and the complementary digital data D2B is "1", then the signal connection between two terminals of the transistor arrays 512 is enabled, and the gamma reference voltage Vr2 is forwarded as the gamma reference voltage Vx0.

Figure 6:
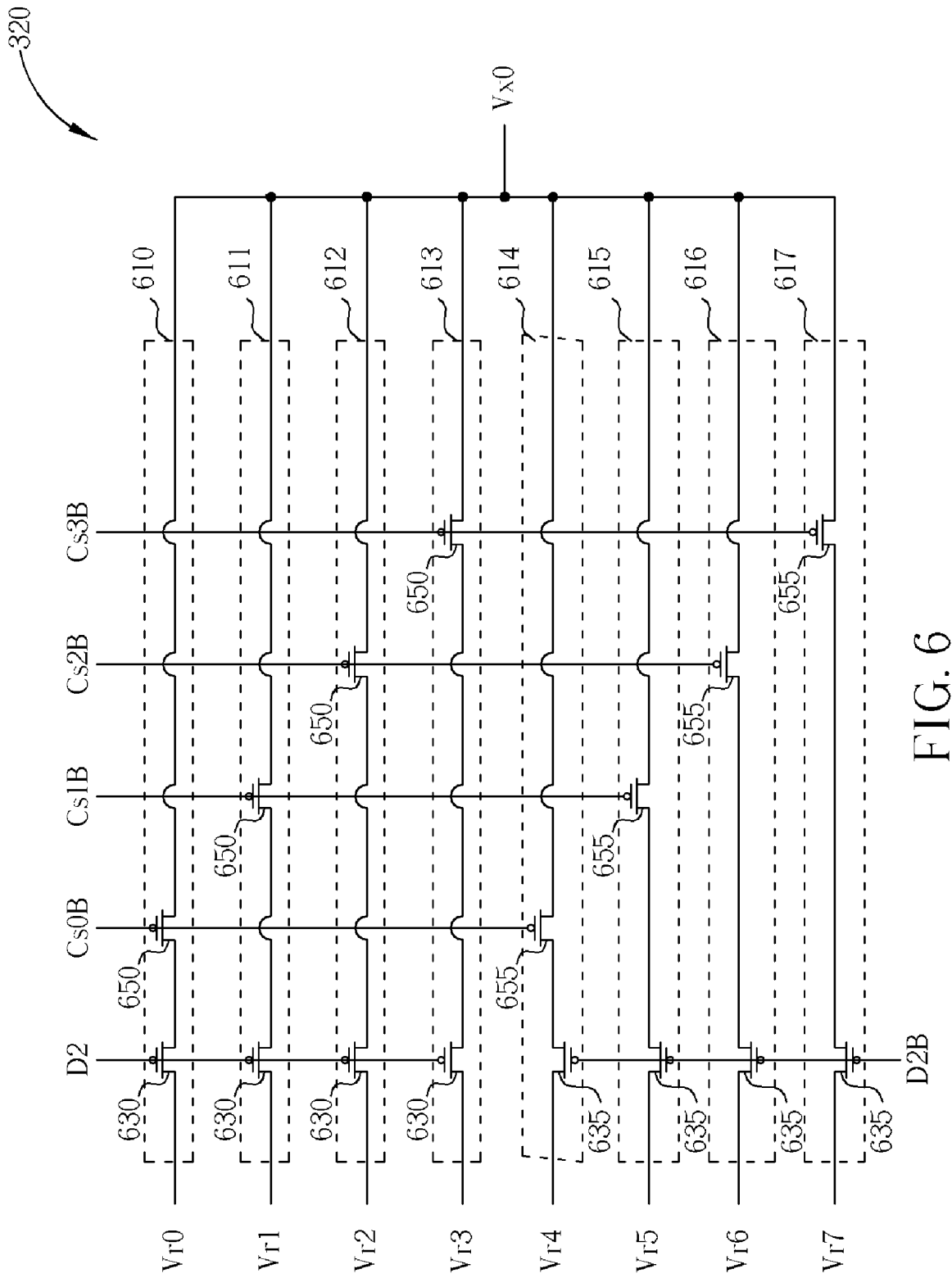
FIG. 6 is a circuit diagram schematically showing the circuit structure of the ROM decoder in FIG. 3 in accordance with another preferred embodiment of the present invention.

Please refer to FIG. 6, which is a circuit diagram schematically showing the circuit structure of the ROM decoder 320 in accordance with another preferred embodiment of the present invention. The ROM decoder 320 in FIG. 6 comprises a plurality of transistor arrays 610-617. Each of the transistor arrays 610-613 comprises PMOS transistors 630 and 650. Each of the transistor arrays 614-617 comprises PMOS transistors 635 and 655. The circuit connections of the ROM decoder 320 in FIG. 6 are similar to the circuit connections of the ROM decoder 320 in FIG. 5, and for the sake of brevity, further description on the circuit connections in FIG. 6 is omitted.

In the same way, the signal connection between two terminals of each of the plurality of transistor arrays 610-617 is controlled by the complementary control signals Cs0B-Cs3B, the digital data D2, or the complementary digital data D2B. For instance, if the control signals Cs0B-Cs3B are "0111" and the digital data D2B is "0", then the signal connection between two terminals of the transistor arrays 614 is enabled, and the gamma reference voltage Vr4 is forwarded as the gamma reference voltage Vx0. Alternatively, if the control signals Cs0B-Cs3B are "1101" and the digital data D2 is "0", then the signal connection between two terminals of the transistor arrays 612 is enabled, and the gamma reference voltage Vr2 is forwarded as the gamma reference voltage Vx0.

It is obvious that all the transistors of the ROM decoder 320 in the circuit structure shown in FIG. 5 are NMOS transistors, and all the transistors of the ROM decoder 320 in the circuit structure shown in FIG. 6 are PMOS transistors. However, the circuit structure of the ROM decoder 320 can be a combination of the circuit structures shown in FIG. 5 and FIG. 6. That is, the circuit structure of the ROM decoder 320 may comprise NMOS transistors and PMOS transistors, and each of the plurality of transistor arrays includes NMOS transistors or PMOS transistors according to the voltage level of the corresponding gamma reference voltage. The implementation of the circuit structures of the ROM decoders 321-327 is similar to the aforementioned embodiments of the ROM decoder 320, and for the sake of brevity, further discussion on the ROM decoders 321-327 is omitted.

Figure 7:
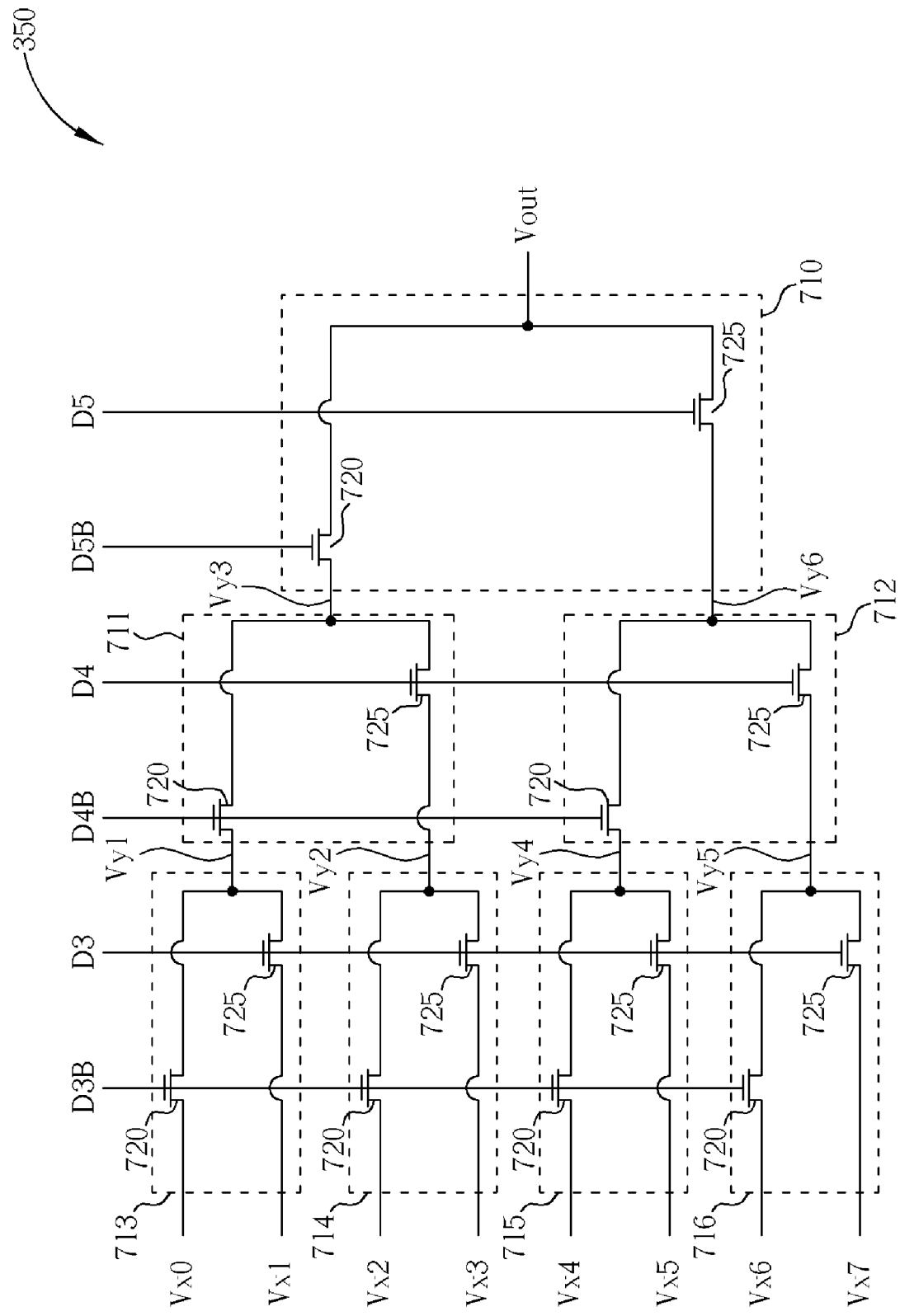
FIG. 7 is a circuit diagram schematically showing the circuit structure of the binary decoder in FIG. 3 in accordance with a preferred embodiment of the present invention.

Please refer to FIG. 7, which is a circuit diagram schematically showing the circuit structure of the binary decoder 350 in accordance with a preferred embodiment of the present invention. The binary decoder 350 comprises a plurality of transistor pairs 710-716. Each of the plurality of transistor pairs 710-716 comprises NMOS transistors 720 and 725. The NMOS transistor 720 has a first end coupled for receiving a first corresponding voltage, a gate coupled for receiving a corresponding complementary digital data, and a second end. The second end of the NMOS transistor 720 outputs the first corresponding voltage received by the first end of the NMOS transistor 720 when the corresponding complementary digital data having high level is furnished to the gate of the NMOS transistor 720. The NMOS transistor 725 has a first end coupled for receiving a second corresponding voltage, a gate coupled for receiving a corresponding digital data, and a second end. The second end of the NMOS transistor 725 outputs the second corresponding voltage received by the first end of the NMOS transistor 725 when the corresponding digital data having high level is furnished to the gate of the NMOS transistor 725.

Accordingly, the transistor pair 713 receives two gamma reference voltages Vx0 and Vx1, and selects one of the two gamma reference voltages Vx0 and Vx1 as a voltage Vy1 for outputting to the transistor pair 711 based on the digital data D3 and the complementary digital data D3B. Similarly, the transistor pair 714 receives two gamma reference voltages Vx2 and Vx3, and selects one of the two gamma reference voltages Vx2 and Vx3 as a voltage Vy2 for outputting to the transistor pair 711 based on the digital data D3 and the complementary digital data D3B. Then, the transistor pair 711 receives the voltages Vy1 and Vy2 forwarded from the two transistor pairs 713 and 714, and selects one of the two voltages Vy1 and Vy2 as a voltage Vy3 for outputting to the transistor pair 710 based on the digital data D4 and the complementary digital data D4B.

Likewise, the transistor pair 715 receives two gamma reference voltages Vx4 and Vx5, and selects one of the two gamma reference voltages Vx4 and Vx5 as a voltage Vy4 for outputting to the transistor pair 712 based on the digital data D3 and the complementary digital data D3B. Similarly, the transistor pair 716 receives two gamma reference voltages Vx6 and Vx7, and selects one of the two gamma reference voltages Vx6 and Vx7 as a voltage Vy5 for outputting to the transistor pair 712 based on the digital data D3 and the complementary digital data D3B. Then, the transistor pair 712 receives the voltages Vy4 and Vy5 forwarded from the two transistor pairs 715 and 716, and selects one of the two voltages Vy4 and Vy5 as a voltage Vy6 for outputting to the transistor pair 710 based on the digital data D4 and the complementary digital data D4B.

Finally, the transistor pair 710 receives the voltages Vy3 and Vy6 forwarded from the two transistor pairs 711 and 712, and selects one of the two voltages Vy3 and Vy6 based on the digital data D5 and the complementary digital data D5B so as to output the output voltage Vout.

In view of the above description, the binary decoder 350 is able to select one of the gamma reference voltages Vx0-Vx7 based on the digital data D5-D3 and the complementary digital data D5B-D3B for outputting the output voltage Vout. For instance, if the digital data D5-D3 are "000" and the complementary digital data D5B-D3B are "111", then only the transistors along a path extended from an input terminal of the gamma reference voltage Vx0 to an output terminal of the output voltage Vout are all turned on. That is, the NMOS transistors 720 of the transistor pairs 710, 711 and 713 are all turned on. The transistors along other paths extended from other input terminals of the gamma reference voltages Vx1-Vx7 to the output terminal of the output voltage Vout are not all turned on. Consequently, the gamma reference voltage Vx0 is selected as the output voltage Vout when the digital data D5-D3 are "000".

Alternatively, if the digital data D5-D3 are "110" and the complementary digital data D5B-D3B are "001", then only the transistors along a path extended from an input terminal of the gamma reference voltage Vx6 to the output terminal of the output voltage Vout are all turned on. That is, the NMOS transistor 720 of the transistor pair 716 and the NMOS transistors 725 of the transistor pairs 710, 712 are all turned on. The transistors along other paths extended from other input terminals of the gamma reference voltages Vx0-Vx5 and Vx7 to the output terminal of the output voltage Vout are not all turned on. Consequently, the gamma reference voltage Vx6 is selected as the output voltage Vout when the digital data D5-D3 are "110".

Figure 8:
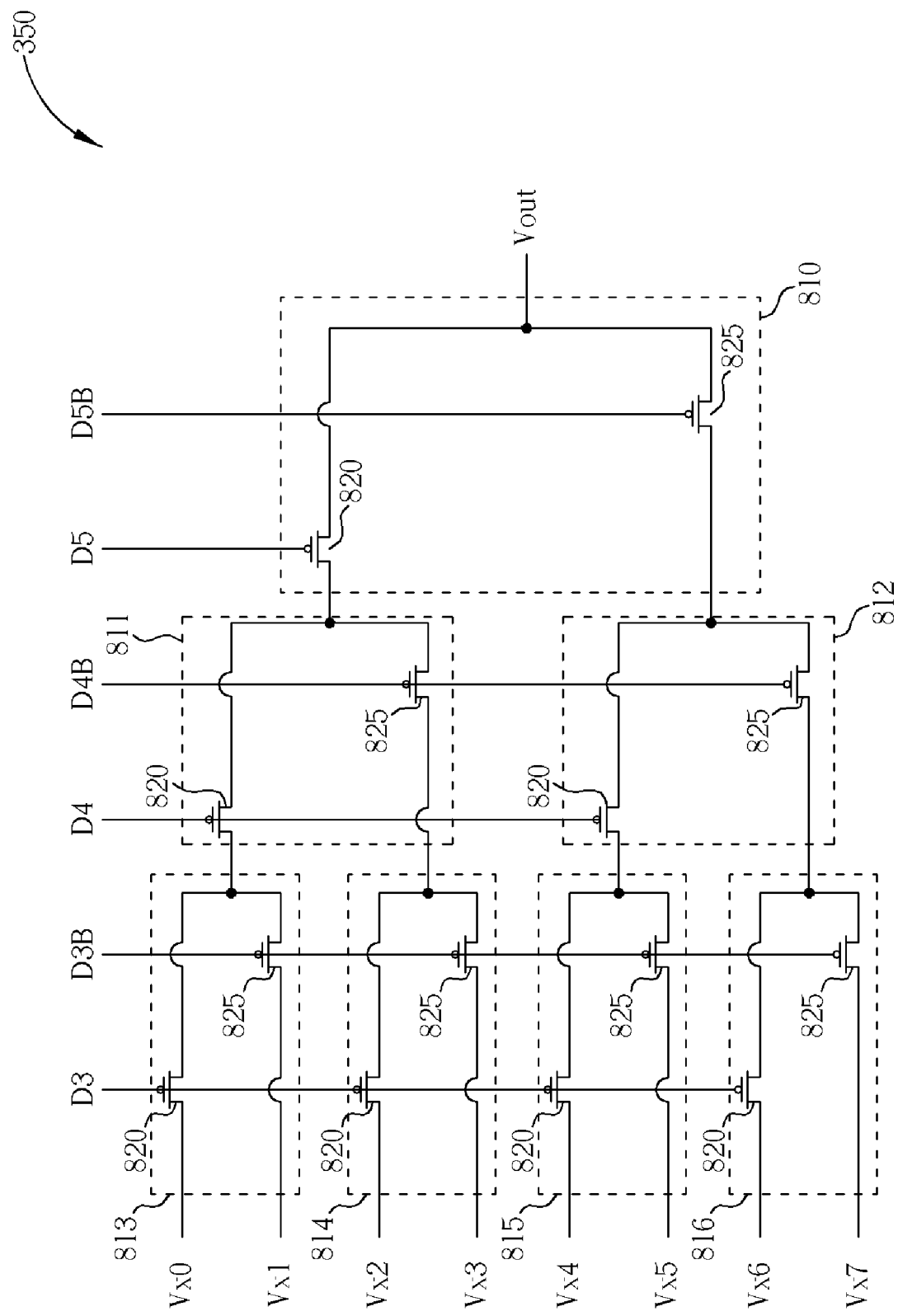
FIG. 8 is a circuit diagram schematically showing the circuit structure of the binary decoder in FIG. 3 in accordance with another preferred embodiment of the present invention.

Please refer to FIG. 8, which is a circuit diagram schematically showing the circuit structure of the binary decoder 350 in accordance with another preferred embodiment of the present invention. The binary decoder 350 in FIG. 8 comprises a plurality of transistor pairs 810-816. Each of the plurality of transistor pairs 810-816 comprises PMOS transistors 820 and 825. The circuit connections of the binary decoder 350 in FIG. 8 are similar to the circuit connections of the binary decoder 350 in FIG. 7, and for the sake of brevity, further description on the circuit connections in FIG. 8 is omitted.

Likewise, the binary decoder 350 in FIG. 8 is able to select one of the gamma reference voltages Vx0-Vx7 based on the digital data D5-D3 and the complementary digital data D5B-D3B for outputting the output voltage Vout. For instance, if the digital data D5-D3 are "001" and the complementary digital data D5B-D3B are "110", then only the transistors along a path extended from an input terminal of the gamma reference voltage Vx1 to an output terminal of the output voltage Vout are all turned on. That is, the PMOS transistor 825 of the transistor pair 813 and the PMOS transistors 820 of the transistor pairs 810, 811 are all turned on. Consequently, the gamma reference voltage Vx1 is selected as the output voltage Vout when the digital data D5-D3 are "001".

Alternatively, if the digital data D5-D3 are "111" and the complementary digital data D5B-D3B are "000", then only the transistors along a path extended from the input terminal of the gamma reference voltage Vx7 to the output terminal of the output voltage Vout are all turned on. That is, the PMOS transistors 825 of the transistor pairs 810, 812 and 816 are all turned on. Consequently, the gamma reference voltage Vx7 is selected as the output voltage Vout when the digital data D5-D3 are "111".

In view of the above description, the binary decoder 350 and the ROM decoders 320-327 of the digital-to-analog converter 300 comprises 142 transistors in total, which is around forty percents of the number of transistors required by the prior-art digital-to-analog converter 290. Accordingly, the device area required by the digital-to-analog converter 300 of the present invention is cutting down significantly.

Figure 9:
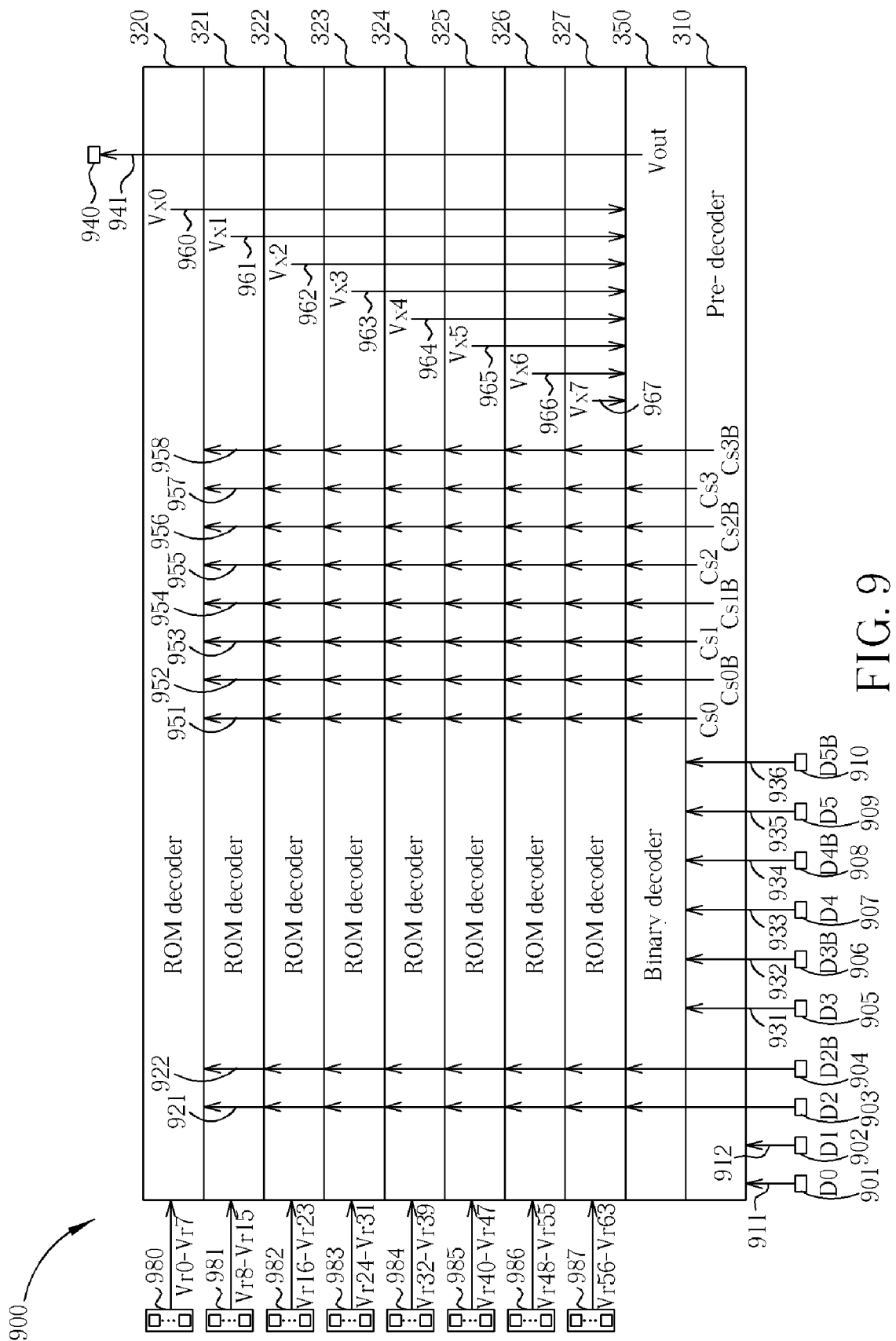
FIG. 9 is a diagram schematically showing a device layout for the digital-to-analog converter in FIG. 3 in accordance with a preferred embodiment of the present invention.

Please refer to FIG. 9, which is a diagram schematically showing a device layout 900 for the digital-to-analog converter 300 in FIG. 3 in accordance with a preferred embodiment of the present invention. The device layout 900 is organized based on a plurality of row areas. A plurality of input pads 901-910 are disposed in a first row area for inputting the digital data D0-D5 and the complementary digital data D2B-D5B. The pre-decoder 310 is disposed in a second row area adjacent to the plurality of input pads 901-910 for receiving the digital data D0 and D1 so as to generate four control signals Cs0-Cs3 and four complementary control signals Cs0B-Cs3B.

The binary decoder 350 is disposed in a third row area adjacent to the pre-decoder 310 for receiving the digital data D3-D5, the complementary digital data D3B-D5B, and the gamma reference voltages Vx0-Vx7, and for selecting one of the gamma reference voltages Vx0-Vx7 based on the digital data D3-D5 and the complementary digital data D3B-D5B so as to output the output voltage Vout. The ROM decoders 327-320 are disposed from a fourth row area to an eleventh row area respectively, and the row areas having successive index values are adjacent to each other. Please note that the positions of the ROM decoders 327-320 are interchangeable without affecting circuit layout complexity.

Each of the ROM decoders 327-320 selects one gamma reference voltage out of a corresponding set of gamma reference voltages for outputting to the binary decoder 350 based on the digital data D2, the complementary digital data D2B, the control signals Cs0-Cs3, or the complementary control signals Cs0B-Cs3B. For instance, the ROM decoder 327 is disposed in the fourth row area adjacent to the binary decoder 350 in the third row area, and is utilized to select one gamma reference voltage out of the set of gamma reference voltages Vr56-Vr63 for outputting the selected gamma reference voltage Vx7 to the binary decoder 350.

Two conductive lines 911 and 912 are disposed for connecting between the pre-decoder 310 and the input pads 901 and 902 respectively for forwarding the digital data D0 and D1 to the pre-decoder 310. Two connective lines 921 and 922 are disposed from the input pads 903 and 904 to the ROM decoder 320 in the eleventh row area for forwarding the digital data D2 and the complementary digital data D2B to the ROM decoders 320-327. That is, the conductive lines 921 and 922 are disposed respectively from the input pads 903 and 904 through the pre-decoder 310, the binary decoder 350, and the ROM decoders 327-321 to the ROM decoder 320, and drop the digital data D2 and the complementary digital data D2B to the ROM decoders 327-320.

Six conductive lines 931-936 are disposed from the input pads 905-910 via the pre-decoder 310 to the binary decoder 350 for forwarding the digital data D3-D5 and the complementary digital data D3B-D5B to the binary decoder 350. Eight connective lines 951-958 are disposed from the pre-decoder 310 to the ROM decoder 320 for forwarding the control signal Cs0-Cs3 and the complementary control signals Cs0B-Cs3B to the ROM decoders 320-327. That is, the conductive lines 951-958 are disposed from the pre-decoder 310 through the binary decoder 350 and the ROM decoders 327-321 to the ROM decoder 320, and drop the control signal Cs0-Cs3 and the complementary control signals Cs0B-Cs3B to the ROM decoders 327-320.

Eight conductive lines 960-967 are disposed between the binary decoder 350 and the ROM decoders 320-327 respectively. The conductive lines 960-967 are utilized for forwarding the selected gamma reference voltages Vx0-Vx7 from the ROM decoders 320-327 to the binary decoder 350 respectively. A conductive line 941 is disposed from the binary decoder 350 via the ROM decoders 327-320 to an output pad 940 for outputting the output voltage Vout. The output pad 940 is disposed in a twelfth row area.

In addition, there are eight pad sets 987-980 disposed adjacent to the ROM decoders 327-320 respectively in the fourth to eleventh row areas. Each of the pad sets 987-980 comprises eight pads for inputting eight corresponding gamma reference voltages, and can be disposed on either side of the corresponding ROM decoder in the corresponding row area. The pad sets 987-980 are utilized to forward eight sets of gamma reference voltages to the ROM decoders 327-320 respectively. For instance, the pad set 987 can be disposed on either side of the ROM decoder 327 in the fourth row area, and is utilized to forward the set of gamma reference voltage Vr56-Vr63 to the ROM decoder 327.

Figure 10:
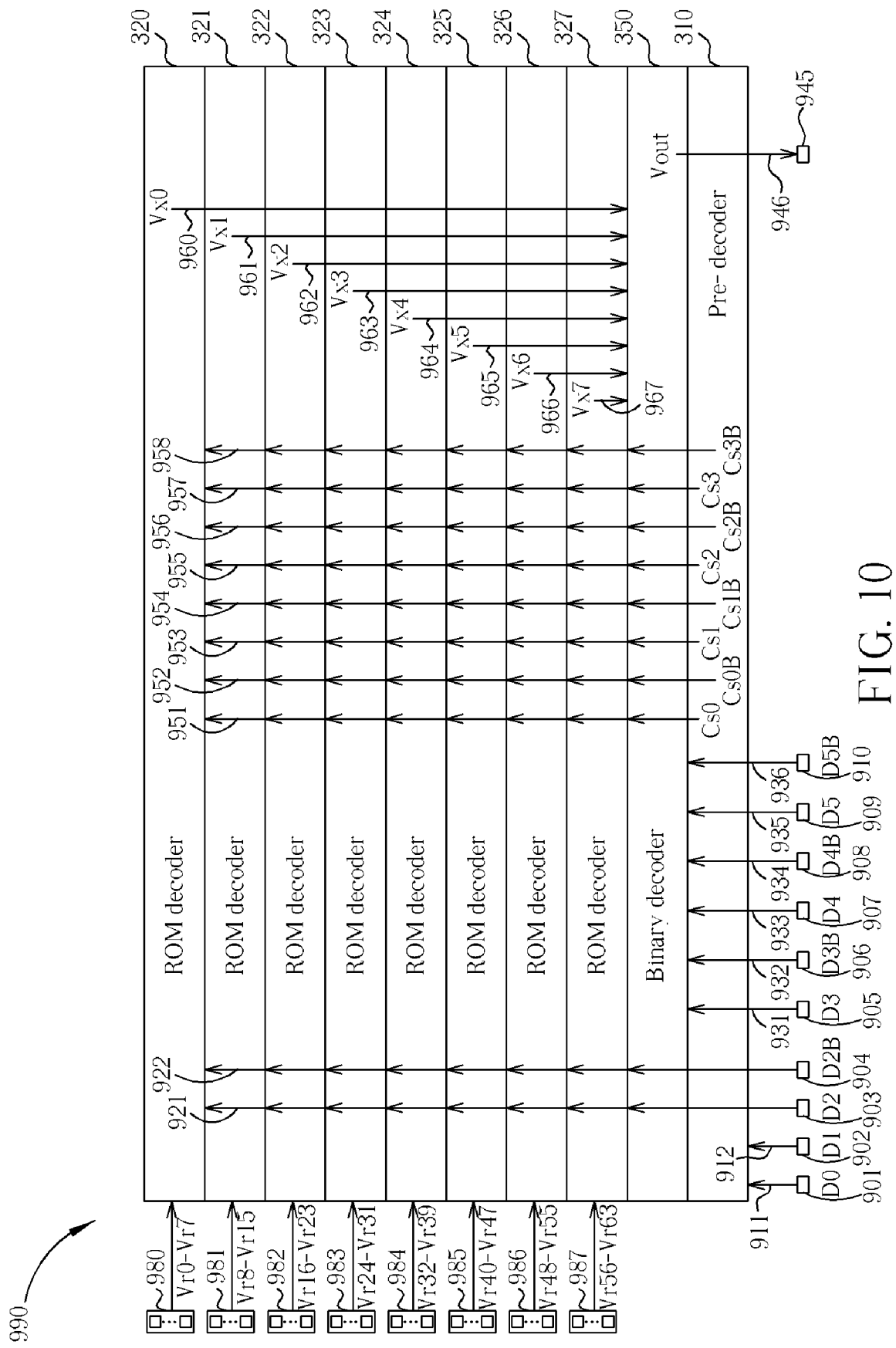
FIG. 10 is a diagram schematically showing a device layout for the digital-to-analog converter in FIG. 3 in accordance with another preferred embodiment of the present invention.

Please refer to FIG. 10, which is a diagram schematically showing a device layout 990 for the digital-to-analog converter 300 in FIG. 3 in accordance with another preferred embodiment of the present invention. Except for the different layout designs of an output pad 945 and a related conductive line 946 in FIG. 10 with respect to the output pad 940 and the related conductive line 941 in FIG. 9, the other layout designs of the device layout 990 are the same as the layout designs of the device layout 900 in FIG. 9. The output pad 945 is disposed in the first row area, and the conductive line 946 is disposed from the binary decoder 350 via the pre-decoder 310 to the output pad 945 for outputting the output voltage Vout.

In summary, the digital-to-analog converter of the present invention requires a much smaller amount of transistors compared to the prior-art digital-to-analog converter. Furthermore, the proposed layout for the digital-to-analog converter of the present invention reduces routing of a plurality of conductive lines for circuit connections. Accordingly, the source driving device of the liquid crystal display device using digital-to-analog converters of the present invention is able to meet the demand for cutting down layout areas significantly so as to achieve thinner appearance and lower production cost.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalent thereof.

What is claimed is:

1. A digital-to-analog converter for selecting one gamma reference voltage out of a plurality of gamma reference voltages based on an N-bit digital data signal so as to output an output voltage, the plurality of gamma reference voltages being divided into a plurality of sets of gamma reference voltages, the digital-to-analog converter comprising:
 a pre-decoder configured to decode an N1-bit sub-signal of the N-bit digital data signal for generating a plurality of control signals and a plurality of complementary control signals;
 a plurality of ROM decoders, each of the plurality of ROM decoders coupled to the pre-decoder for selecting one gamma reference voltage out of one corresponding set of gamma reference voltages based on the control signals, the complementary control signals, an N2-bit sub-signal of the N-bit digital signal, and a complement of the N2-bit sub-signal; and
 a binary decoder coupled to the plurality of ROM decoders for selecting one of the gamma reference voltages selected by the plurality of ROM decoders based on an N3-bit sub-signal of the N-bit digital signal and a complement of the N3-bit sub-signal so as to output the output voltage.

2. The digital-to-analog converter of claim 1, further comprising:
 a gamma reference voltage generating circuit coupled to the plurality of ROM decoders for providing the plurality of gamma reference voltages.

3. The digital-to-analog converter of claim 1, wherein each of the plurality of ROM decoders comprises a plurality of transistor arrays, each of the plurality of transistor arrays comprises:
 a first transistor having a first end coupled for receiving a corresponding gamma reference voltage of one corresponding set of gamma reference voltages, a second end, and a gate coupled for receiving a bit of the N2-bit sub-signal or a bit of the complement of the N2-bit sub-signal; and
 a second transistor having a first end coupled to the second end of the first transistor, a gate coupled for receiving a corresponding control signal or a corresponding complementary control signal, and a second end coupled for outputting the corresponding gamma reference voltage received by the first transistor.

4. The digital-to-analog converter of claim 3, wherein the first transistors of the plurality of transistor arrays of one of the ROM decoders are disposed to rank in a column.

5. The digital-to-analog converter of claim 3, wherein the second transistors of the plurality of transistor arrays of one of the ROM decoders are disposed to rank in a column.

6. The digital-to-analog converter of claim 3, wherein the first transistors include NMOS transistors or PMOS transistors.

7. The digital-to-analog converter of claim 3, wherein the second transistors include NMOS transistors or PMOS transistors.

8. The digital-to-analog converter of claim 1, wherein the binary decoder comprises:
 a first column comprising a transistor pair including:
  a first transistor having a first end coupled to an output of the binary decoder, a second end coupled to an output of a first transistor pair of a second column, and a gate coupled to a first bit of the N3-bit sub-signal or a complement of the first bit of the N3-bit sub-signal; and a second transistor having a first end coupled to the output of the binary decoder, a second end coupled to an output of a second transistor pair of the second column, and a gate coupled to the complement of the first bit of the N3-bit sub-signal or the first bit of the N3-bit sub-signal;

a Kth column comprising $2^{(K-1)}$ transistor pairs, a first transistor pair of the $2^{(K-1)}$ transistor pairs including:

a first transistor having a first end coupled to an output of the first transistor pair of the $2^{(K-1)}$ transistor pairs of the Kth column, a second end coupled to an output of a first transistor pair of a (K+1)th column, and a gate coupled to a Kth bit of the N3-bit sub-signal or a complement of the Kth bit of the N3-bit sub-signal; and a second transistor having a first end coupled to the output of the first transistor pair of the $2^{(K-1)}$ transistor pairs of the Kth column, a second end coupled to an output of a second transistor pair of the (K+1)th column, and a gate coupled to the complement of the Kth bit of the N3-bit sub-signal or the Kth bit of the N3-bit sub-signal; and a Tth column comprising $2^{(T-1)}$ transistor pairs, a first transistor pair of the $2^{(T-1)}$ transistor pairs including:

a first transistor having a first end coupled to an output of the first transistor pair of the $2^{(T-1)}$ transistor pairs of the Tth column, a second end coupled to a first gamma reference voltage selected by a corresponding ROM decoder, and a gate coupled to a Tth bit of the N3-bit sub-signal or a complement of the Tth bit of the N3-bit sub-signal; and a second transistor having a first end coupled to the output of the first transistor pair of the $2^{(T-1)}$ transistor pairs of the Tth column, a second end coupled to a second gamma reference voltage selected by a corresponding ROM decoder, and a gate coupled to the complement of the Tth bit of the N3-bit sub-signal or the Tth bit of the N3-bit sub-signal wherein $T \geq 3$.

9. The digital-to-analog converter of claim 8, wherein the first and second transistors of the first column include NMOS transistors or PMOS transistors.

10. The digital-to-analog converter of claim 8, wherein the first and second transistors of the Kth column include NMOS transistors or PMOS transistors.

11. The digital-to-analog converter of claim 8, wherein the first and second transistors of the Tth column include NMOS transistors or PMOS transistors.

12. The digital-to-analog converter of claim 1, wherein the N-bit digital data signal is a 6-bit signal, the N1-bit sub-signal is a 2-bit signal, the N2-bit sub-signal is a 1-bit signal, and the N3-bit sub-signal is a 3-bit signal.

13. The digital-to-analog converter of claim 12, wherein the pre-decoder is a two-to-four decoder for generating four control signals and four complementary control signals by decoding the 2-bit signal.

14. A digital-to-analog converter, comprising:

a plurality of input pads disposed in a first row area for inputting a digital data signal and a complement of the digital data signal;

a pre-decoder disposed in a second row area adjacent to the first row area for receiving an N1-bit sub-signal of the digital data signal from corresponding input pads, and for decoding the N1-bit sub-signal so as to output a plurality of control signals and a plurality of complementary control signals;

a binary decoder disposed in a third row area adjacent to the second row area for receiving an N3-bit sub-signal of the digital data signal and a complement of the N3-bit sub-signal from corresponding input pads, and for selecting one of a first gamma reference voltage and a second gamma reference voltage based on the N3-bit sub-signal and the complement of the N3-bit sub-signal so as to output an output voltage;

a first ROM decoder disposed in a fourth row area adjacent to the third row area for receiving an N2-bit sub-signal of the digital data signal and a complement of the N2-bit sub-signal from corresponding input pads, and receiving the control signals and the complementary control signals from the pre-decoder, and for selecting one gamma reference voltage of a first set of gamma reference voltages based on the control signals, the complementary control signals, the N2-bit sub-signal and the complement of the N2-bit sub-signal so as to output the first gamma reference voltage; and a second ROM decoder disposed in a fifth row area adjacent to the fourth row area for receiving the N2-bit sub-signal of the digital data signal and the complement of the N2-bit sub-signal from the corresponding input pads, and receiving the control signals and the complementary control signals from the pre-decoder, and for selecting one gamma reference voltage of a second set of gamma reference voltages based on the control signals, the complementary control signals, the N2-bit sub-signal and the complement of the N2-bit sub-signal so as to output the second gamma reference voltage.

15. The digital-to-analog converter of claim 14, further comprising:

a plurality of first conductive lines connected between the first ROM decoder and the corresponding input pads for forwarding the N2-bit sub-signal and the complement of the N2-bit sub-signal to the first ROM decoder, wherein the plurality of first conductive lines are disposed through the pre-decoder and the binary decoder; and a plurality of second conductive lines connected between the second ROM decoder and the plurality of first conductive lines respectively for forwarding the N2-bit sub-signal and the complement of the N2-bit sub-signal from the first ROM decoder to the second ROM decoder.

16. The digital-to-analog converter of claim 14, further comprising:

a plurality of conductive lines connected between the binary decoder and the corresponding input pads for forwarding the N3-bit sub-signal and the complement of the N3-bit sub-signal to the binary decoder, wherein the plurality of conductive lines are disposed through the pre-decoder.

17. The digital-to-analog converter of claim 14, further comprising:

a plurality of first conductive lines connected between the pre-decoder and the first ROM decoder for forwarding the control signals and the complementary control signals from the pre-decoder to the first ROM decoder, wherein the plurality of first conductive lines are disposed through the binary decoder; and a plurality of second conductive lines connected between the second ROM decoder and the plurality of first conductive lines respectively for forwarding the control signals and the complementary control signals from the first ROM decoder to the second ROM decoder.

18. The digital-to-analog converter of claim 14, further comprising:
- a first conductive line connected between the first ROM decoder and the binary decoder for forwarding the first gamma reference voltage from the first ROM decoder to the binary decoder; and
- a second conductive line connected between the second ROM decoder and the binary decoder for forwarding the second gamma reference voltage from the second ROM decoder to the binary decoder, wherein the second conductive line is disposed through the first ROM decoder.

19. The digital-to-analog converter of claim 14, further comprising:
- an output pad disposed in a sixth row area adjacent to the fifth row area; and
- a conductive line connected between the binary decoder and the output pad for forwarding the output voltage from the binary decoder to the output pad, wherein the conductive line is disposed through the first ROM decoder and the second ROM decoder.

20. The digital-to-analog converter of claim 14, further comprising:
- an output pad disposed in the first row area; and
- a conductive line connected between the binary decoder and the output pad for forwarding the output voltage from the binary decoder to the output pad, wherein the conductive line is disposed through the pre-decoder.

21. The digital-to-analog converter of claim 14, wherein the positions of the first ROM decoder and the second ROM decoder can be interchanged.

22. The digital-to-analog converter of claim 14, further comprising:
- a plurality of conductive lines connected between the pre-decoder and the corresponding input pads for forwarding the N1-bit sub-signal to the pre-decoder.

23. The digital-to-analog converter of claim 14, further comprising:
- a plurality of first pads disposed in the fourth row area adjacent to the first ROM decoder for forwarding the first set of gamma reference voltages to the first ROM decoder; and
- a plurality of second pads disposed in the fifth row area adjacent to the second ROM decoder for forwarding the second set of gamma reference voltages to the second ROM decoder.

* * * * *